US011749574B2

(12) United States Patent
Katayama (10) Patent No.: US 11,749,574 B2
(45) Date of Patent: Sep. 5, 2023

(54) METHOD OF MANUFACTURING SEMICONDUCTOR PACKAGE

(71) Applicant: Nippon Electric Glass Co., Ltd., Shiga (JP)

(72) Inventor: Hiroki Katayama, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 126 days.

(21) Appl. No.: 17/388,521

(22) Filed: Jul. 29, 2021

(65) Prior Publication Data

US 2021/0358822 A1 Nov. 18, 2021

Related U.S. Application Data

(62) Division of application No. 15/507,876, filed as application No. PCT/JP2015/066325 on Jun. 5, 2015, now abandoned.

(30) Foreign Application Priority Data

Sep. 25, 2014 (JP) .................................. 2014-194598

(51) Int. Cl.
*H01L 23/15* (2006.01)
*H01L 23/00* (2006.01)
(Continued)

(52) U.S. Cl.
CPC .............. *H01L 23/15* (2013.01); *B24B 37/07* (2013.01); *B32B 17/06* (2013.01); *C03C 3/091* (2013.01); *C03C 3/093* (2013.01); *C03C 19/00* (2013.01); *H01L 21/56* (2013.01); *H01L 21/561* (2013.01); *H01L 21/568* (2013.01); *H01L 23/12* (2013.01); *H01L 24/19* (2013.01); *H01L 24/96* (2013.01); *B32B 2307/538* (2013.01);
(Continued)

(58) Field of Classification Search
CPC ......... H01L 23/15; H01L 21/56; H01L 24/19; H01L 2224/04105; H01L 2224/12105; B24B 37/07; C03C 19/00
USPC ........................................................ 257/678
See application file for complete search history.

(56) References Cited

U.S. PATENT DOCUMENTS

2004/0009637 A1   1/2004  Ishikawa
2008/0174002 A1   7/2008  Chen et al.
(Continued)

FOREIGN PATENT DOCUMENTS

CN   101335224   12/2008
CN   103359913   10/2013
(Continued)

OTHER PUBLICATIONS

International Search Report dated Jul. 14, 2015 in International (PCT) Application No. PCT/JP2015/066325.
(Continued)

*Primary Examiner* — Xia L Cross
(74) *Attorney, Agent, or Firm* — Wenderoth, Lind & Ponack, L.L.P.

(57) ABSTRACT

Devised are a supporting substrate capable of contributing to an increase in density of a semiconductor package and a laminate using the supporting substrate. A supporting glass substrate of the present invention includes a polished surface on a surface thereof and has a total thickness variation of less than 2.0 μm.

10 Claims, 5 Drawing Sheets

(51) Int. Cl.
    *H01L 23/12*     (2006.01)
    *H01L 21/56*     (2006.01)
    *C03C 3/093*     (2006.01)
    *C03C 3/091*     (2006.01)
    *B32B 17/06*     (2006.01)
    *C03C 19/00*     (2006.01)
    *B24B 37/07*     (2012.01)

(52) U.S. Cl.
    CPC . *B32B 2457/14* (2013.01); *H01L 2224/04105* (2013.01); *H01L 2224/12105* (2013.01); *H01L 2924/3511* (2013.01)

(56) References Cited

U.S. PATENT DOCUMENTS

| | | | | |
|---|---|---|---|---|
| 2009/0115028 | A1* | 5/2009 | Shimomura | H01L 27/1214 257/623 |
| 2011/0177287 | A1* | 7/2011 | Kato | C03C 3/091 65/95 |
| 2012/0302063 | A1 | 11/2012 | Markham | |
| 2013/0136952 | A1* | 5/2013 | Yukimatsu | G01B 7/28 702/167 |
| 2013/0168874 | A1 | 7/2013 | Scanlan | |
| 2013/0228918 | A1* | 9/2013 | Chen | H01L 23/5384 257/737 |
| 2014/0312492 | A1* | 10/2014 | Mao | H01L 24/19 257/737 |
| 2017/0297946 | A1 | 10/2017 | Katayama | |
| 2017/0334773 | A1 | 11/2017 | Katayama | |
| 2017/0345699 | A1 | 11/2017 | Katayama | |

FOREIGN PATENT DOCUMENTS

| | | |
|---|---|---|
| JP | 2006-176341 | 7/2006 |
| JP | 2012-238894 | 12/2012 |
| WO | 2013/047585 | 4/2013 |
| WO | 2013/134237 | 9/2013 |

OTHER PUBLICATIONS

International Preliminary Report on Patentability and Written Opinion of the International Searching Authority dated Mar. 28, 2017 in International (PCT) Application No. PCT/JP2015/066325.

Chinese Office Action dated Dec. 28, 2018 in corresponding Chinese Patent Application No. 201580038603.3 with English translation of Search Report.

Office Action dated Jun. 12, 2020 in corresponding Taiwanese Patent Application No. 104131520, with English translation of Search Report.

\* cited by examiner

METHOD OF MANUFACTURING SEMICONDUCTOR PACKAGE

TECHNICAL FIELD

The present invention relates to a supporting glass substrate and a laminate using the supporting glass substrate, and more specifically, to a supporting glass substrate to be used for supporting a processed substrate in a manufacturing process for a semiconductor package and a laminate using the supporting glass substrate.

BACKGROUND ART

Portable electronic devices, e.g., a cellular phone, a notebook-size personal computer, and a personal data assistance (PDA), are required to be downsized and reduced in weight. Along with this, a mounting space for semiconductor chips to be used in those electronic devices is strictly limited, and there is a problem of high-density mounting of the semiconductor chips. In view of this, in recent years, there has been an attempt to perform high-density mounting of a semiconductor package by a three-dimensional mounting technology, that is, by laminating semiconductor chips on top of another and connecting the semiconductor chips through wiring.

A related-art wafer level package (WLP) is manufactured by forming bumps into a wafer shape and dicing the wafer into chips. However, the related-art WLP has problems in that it is difficult to increase the number of pins, and chipping and the like of semiconductor chips are liable to occur because the semiconductor chips are mounted in a state in which the back surfaces thereof are exposed.

Therefore, as a new WLP, a fan-out type WLP has been proposed. In the fan-out type WLP, it is possible to increase the number of pins, and chipping and the like of semiconductor chips can be prevented by protecting end portions of the semiconductor chips.

SUMMARY OF INVENTION

Technical Problem

The method of manufacturing the fan-out type WLP includes the step of molding a plurality of semiconductor chips with a sealing material of a resin, to thereby form a processed substrate, followed by arranging wiring on one surface of the processed substrate, the step of forming solder bumps, and the like.

Those steps involve heat treatment at about 200° C., and hence there is a risk in that the sealing material may be deformed, and the processed substrate may change in dimension. When the processed substrate changes in dimension, it becomes difficult to arrange wiring at high density on one surface of the processed substrate, and it is also difficult to form the solder bumps accurately.

In order to suppress the change in dimension of the processed substrate, it is effective to use a supporting substrate configured to support the processed substrate. However, even when the supporting substrate is used, it may be difficult to arrange wiring at high density on one surface of the processed substrate in some cases.

The present invention has been made in view of the above-mentioned circumstances, and it is a technical object of the present invention to devise a supporting substrate capable of contributing to an increase in density of a semiconductor package and a laminate using the supporting substrate.

Solution to Problem

The inventor of the present invention has repeatedly conducted various experiments, and as a result, has found that the above-mentioned technical object can be achieved by adopting a glass substrate as a supporting substrate and reducing a total thickness variation, with a surface of the glass substrate being a polished surface, to thereby propose the finding as the present invention. That is, a supporting glass substrate according to one embodiment of the present invention comprises a polished surface on a surface thereof and has a total thickness variation of less than 5.0 μm. The term "total thickness variation" as used herein refers to a difference between a maximum thickness and a minimum thickness of the entire supporting glass substrate and can be measured with, for example, a Bow/Warp measurement apparatus SBW-331ML/d manufactured by Kobelco Research Institute, Inc.

The glass substrate is smoothened easily on the surface thereof and has stiffness. Therefore, when the glass substrate is used as the supporting substrate, the processed substrate can be supported strongly and accurately. In particular, as the total thickness variation of the glass substrate becomes smaller, the processed substrate is supported more accurately, and hence the accuracy of the processing treatment is enhanced more easily. The glass substrate easily transmits light such as UV rays. Therefore, when the glass substrate is used as the supporting substrate, the processed substrate and the supporting glass substrate can be easily fixed to each other through formation of an adhesive layer or the like. The processed substrate and the supporting glass substrate can also be easily separated from each other through formation of a peeling layer or the like.

Secondly, it is preferred that the supporting glass substrate according to the embodiment of the present invention have a total thickness variation of less than 2.0 μm.

Thirdly, it is preferred that the supporting glass substrate according to the embodiment of the present invention have a warpage level of 60 μm or less. The term "warpage level" as used herein refers to a total of an absolute value of a maximum distance between a highest point and a least squares focal plane of the entire supporting glass substrate, and an absolute value of a maximum distance between a lowest point and the least squares focal plane thereof, and can be measured with, for example, the Bow/Warp measurement apparatus SBW-331ML/d manufactured by Kobelco Research Institute, Inc.

Fourthly, a supporting glass substrate according to one embodiment of the present invention comprises a polished surface on a surface thereof and has a total thickness variation of less than 2.0 μm, wherein the supporting glass substrate is formed by an overflow down-draw method.

Fifthly, it is preferred that the supporting glass substrate of the present invention be used for supporting a processed substrate in a manufacturing process for a semiconductor package.

Sixthly, it is preferred that the supporting glass substrate according to the embodiment of the present invention have a Young's modulus of 65 GPa or more. The term "Young's modulus" as used herein refers to a value obtained by measurement using a bending resonance method. 1 GPa is equivalent to about 101.9 Kgf/mm$^2$.

Seventhly, it is preferred that a laminate according to one embodiment of the present invention comprise at least a processed substrate and a supporting glass substrate configured to support the processed substrate, the supporting glass substrate comprising the above-mentioned supporting glass substrate.

Eighthly, it is preferred that, in the laminate according to the embodiment of the present invention, the processed substrate comprise at least a semiconductor chip molded with a sealing material.

Ninthly, it is preferred that a method of manufacturing a semiconductor package according to one embodiment of the present invention comprise the steps of: preparing a laminate comprising at least a processed substrate and a supporting glass substrate configured to support the processed substrate; conveying the laminate; and subjecting the processed substrate to processing treatment, the supporting glass substrate comprising the above-mentioned supporting glass substrate. The "step of conveying the laminate" and the "step of subjecting the processed substrate to processing treatment" are not required to be performed separately and may be performed simultaneously.

Tenthly, it is preferred that, in the method of manufacturing a semiconductor package according to the embodiment of the present invention, the processing treatment comprise a step of arranging wiring on one surface of the processed substrate.

Eleventhly, it is preferred that, in the method of manufacturing a semiconductor package according to the embodiment of the present invention, the processing treatment comprise a step of forming a solder bump on the one surface of the processed substrate.

Twelfthly, it is preferred that a semiconductor package according to one embodiment of the present invention be manufactured by the above-mentioned method of manufacturing a semiconductor package.

Thirteenthly, it is preferred that an electronic device according to one embodiment of the present invention comprise a semiconductor package, the semiconductor package comprising the above-mentioned semiconductor package.

DESCRIPTION OF EMBODIMENTS

A supporting glass substrate of the present invention has a polished surface on a surface thereof, and the polished surface accounts for preferably 50% or more, more preferably 70% or more, still more preferably 90% or more of the surface. With this, the total thickness variation is reduced easily, and the warpage level is also reduced easily.

Figure 5:
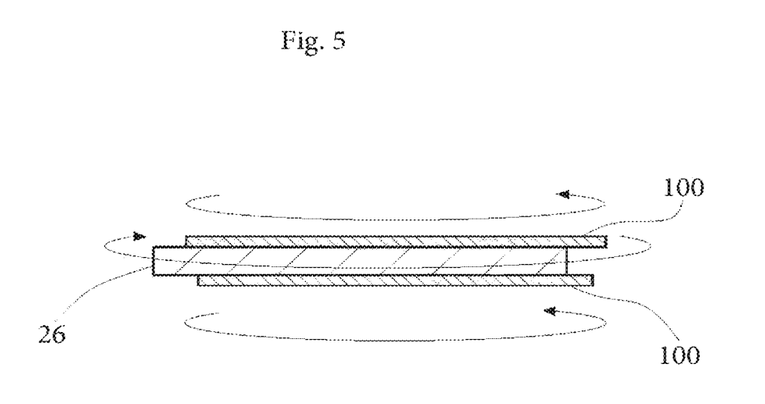
FIG. 5 is a schematic sectional view for illustrating polishing treatment.

As a method for polishing treatment, various methods may be adopted. However, as illustrated in FIG. 5, a method involving sandwiching both surfaces of a glass substrate with a pair of polishing pads 100 and subjecting the glass substrate to the polishing treatment while rotating the glass substrate and the pair of polishing pads together is preferred. It is preferred that the pair of polishing pads have different outer diameters, and it is preferred that the polishing treatment be performed so that a part of the glass substrate intermittently extends off from the polishing pads during polishing. With this, the total thickness variation is reduced easily, and the warpage level is also reduced easily. In the polishing treatment, there is no particular limitation on the polishing depth, but the polishing depth is preferably 50 μm or less, 30 μm or less, or 20 μm or less, particularly preferably 10 μm or less. As the polishing depth becomes smaller, the productivity of the supporting glass substrate 26 is enhanced.

In the supporting glass substrate of the present invention, the total thickness variation is less than 5 μm, preferably less than 2 μm, 1.5 μm or less, 1 μm or less, less than 1 μm, 0.8 μm or less, or from 0.1 μm to 0.9 μm, particularly preferably from 0.2 μm to 0.7 μm. As the total thickness variation becomes smaller, the accuracy of processing treatment can be enhanced easily. In particular, the wiring accuracy can be enhanced, and hence high-density wiring can be performed. The strength of the supporting glass substrate is enhanced, with the result that the supporting glass substrate and the laminate are less liable to be broken. The number of times of reuse of the supporting glass substrate can be increased.

The warpage level is preferably 60 μm or less, 55 μm or less, 50 μm or less, or from 1 μm to 45 μm, particularly preferably from 5 μm to 40 μm. As the warpage level becomes smaller, the accuracy of the processing treatment is enhanced easily. In particular, the wiring accuracy can be enhanced, and hence high-density wiring can be performed. The number of times of reuse of the supporting glass substrate can be increased.

The arithmetic average roughness Ra is preferably 10 nm or less, 5 nm or less, 2 nm or less, or 1 nm or less, particularly preferably 0.5 nm or less. As the arithmetic average roughness Ra becomes smaller, the accuracy of the processing treatment can be enhanced easily. In particular, the wiring accuracy is enhanced, and hence high-density wiring can be performed. The strength of the supporting glass substrate can be enhanced, with the result that the supporting glass substrate and the laminate are less liable to be broken. The number of times of reuse of the supporting glass substrate can be increased. The "arithmetic average roughness Ra" can be measured with an atomic force microscope (AFM).

It is preferred that the supporting glass substrate of the present invention have a substantially disc shape or wafer shape, and the diameter thereof is preferably 100 mm or more and 500 mm or less, particularly preferably 150 mm or more and 450 mm or less. With this, the supporting glass substrate is easily applied to the manufacturing process for a semiconductor package. As necessary, the supporting glass substrate may be processed into another shape, such as a rectangular shape.

In the supporting glass substrate of the present invention, the thickness is preferably less than 2.0 mm, 1.5 mm or less, 1.2 mm or less, 1.1 mm or less, or 1.0 mm or less, particularly preferably 0.9 mm or less. As the thickness becomes smaller, the mass of the laminate is reduced in weight, and hence a handling property is enhanced. Meanwhile, when the thickness is excessively small, the strength of the supporting substrate itself decreases, with the result that the supporting substrate may not perform a function thereof. Thus, the thickness is preferably 0.1 mm or more, 0.2 mm or more, 0.3 mm or more, 0.4 mm or more, 0.5 mm or more, or 0.6 mm or more, particularly preferably more than 0.7 mm.

It is preferred that the supporting glass substrate of the present invention have the following characteristics.

In the supporting glass substrate of the present invention, it is preferred that the average thermal expansion coefficient within a temperature range of from 30° C. to 380° C. be $0\times10^{-7}/°$ C. or more and $120\times10^{-7}/°$ C. or less. With this, the thermal expansion coefficients of the processed substrate and the supporting glass substrate are easily matched with each other. When the thermal expansion coefficients of the processed substrate and the supporting glass substrate are matched with each other, a change in dimension (in particular, warping deformation) of the processed substrate during the processing treatment is suppressed easily. As a result, wiring can be arranged at high density on one surface of the processed substrate, and solder bumps can also be formed thereon accurately. The "average thermal expansion coefficient within a temperature range of from 30° C. to 380° C." can be measured with a dilatometer.

It is preferred that the average thermal expansion coefficient within a temperature range of from 30° C. to 380° C. be increased when the ratio of the semiconductor chips within the processed substrate is small and the ratio of the sealing material within the processed substrate is large. Meanwhile, it is preferred that the average thermal expansion coefficient be decreased when the ratio of the semiconductor chips within the processed substrate is large and the ratio of the sealing material within the processed substrate is small.

When the average thermal expansion coefficient within a temperature range of from 30° C. to 380° C. is set to $0\times10^{-7}/°$ C. or more and less than $50\times10^{-7}/°$ C., the supporting glass substrate preferably comprises as a glass composition, in terms of mass %, 55% to 75% of $SiO_2$, 15% to 30% of $Al_2O_3$, 0.1% to 6% of $Li_2O$, 0% to 8% of $Na_2O+K_2O$, and 0% to 10% of $MgO+CaO+SrO+BaO$, or preferably comprises 55% to 75% of $SiO_2$, 10% to 30% of $Al_2O_3$, 0% to 0.3% of $Li_2O+Na_2O+K_2O$, and 5% to 20% of $MgO+CaO+SrO+BaO$. When the average thermal expansion coefficient within a temperature range of from 30° C. to 380° C. is set to $50\times10^{-7}/°$ C. or more and less than $75\times10^{-7}/°$ C., the supporting glass substrate preferably comprises as a glass composition, in terms of mass %, 55% to 70% of $SiO_2$, 3% to 15% to $Al_2O_3$, 5% to 20% of $B_2O_3$, 0% to 5% of MgO, 0% to 10% of CaO, 0% to 5% of SrO, 0% to 5% of BaO, 0% to 5% of ZnO, 5% to 15% of $Na_2O$, and 0% to 10% of $K_2O$. When the average thermal expansion coefficient within a temperature range of from 30° C. to 380° C. is set to $75\times10^{-7}/°$ C. or more and $85\times10^{-7}/°$ C. or less, the supporting glass substrate preferably comprises as a glass composition, in terms of mass %, 60% to 75% of $SiO_2$, 5% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 7% to 16% of $Na_2O$, and 0% to 8% of $K_2O$. When the average thermal expansion coefficient within a temperature range of from 30° C. to 380° C. is set to more than $85\times10^{-7}/°$ C. and $120\times10^{-7}/°$ C. or less, the supporting glass substrate preferably comprises as a glass composition, in terms of mass %, 55% to 70% of $SiO_2$, 3% to 13% of $Al_2O_3$, 2% to 8% of $B_2O_3$, 0% to 5% of MgO, 0% to 10% of CaO, 0% to 5% of SrO, 0% to 5% of BaO, 0% to 5% of ZnO, 10% to 21% of $Na_2O$, and 0% to 5% of $K_2O$. With this, the thermal expansion coefficient is regulated easily within a desired range, and devitrification resistance is enhanced. Therefore, a glass substrate having a small total thickness variation is formed easily.

In the supporting glass substrate of the present invention, the Young's modulus is preferably 65 GPa or more, 67 GPa or more, 68 GPa or more, 69 GPa or more, 70 GPa or more, 71 GPa or more, or 72 GPa or more, particularly preferably 73 GPa or more. When the Young's modulus is excessively low, it becomes difficult to maintain the stiffness of the laminate, and the deformation, warpage, and breakage of the processed substrate are liable to occur.

The liquidus temperature is preferably less than 1,150° C., 1,120° C. or less, 1,100° C. or less, 1,080° C. or less, 1,050° C. or less, 1,010° C. or less, 980° C. or less, 960° C. or less, or 950° C. or less, particularly preferably 940° C. or less. With this, a glass substrate is formed easily by a down-draw method, in particular, an overflow down-draw method. Therefore, a glass substrate having a small thickness is manufactured easily, and the total thickness variation after forming can be reduced. During forming, a devitrified crystal is less liable to be generated. As a result, the total thickness variation is reduced easily to less than 2.0 μm through a small amount of polishing. The term "liquidus temperature" as used herein can be calculated by loading glass powder that has passed through a standard 30-mesh sieve (500 μm) and remained on a 50-mesh sieve (300 μm) into a platinum boat, then keeping the glass powder for 24 hours in a gradient heating furnace, and measuring a temperature at which crystals of glass are deposited.

The viscosity at a liquidus temperature is preferably $10^{4.6}$ dPa·s or more, $10^{5.0}$ dPa·s or more, $10^{5.2}$ dPa·s or more, $10^{5.4}$ dPa·s or more, or $10^{5.6}$ dPa·s or more, particularly preferably $10^{5.8}$ dPa·s or more. With this, a glass substrate is formed easily by a down-draw method, in particular, an overflow down-draw method. Therefore, a glass substrate having a small thickness is manufactured easily, and the total thickness variation after forming can be reduced. During forming, a devitrified crystal is less liable to be generated. As a result, the total thickness variation is reduced easily to less than 2.0 μm through a small amount of polishing. The "viscosity at a liquidus temperature" can be measured by a platinum sphere pull up method. The viscosity at a liquidus temperature is an indicator of formability. As the viscosity at a liquidus temperature becomes higher, the formability is enhanced.

The temperature at $10^{2.5}$ dPa·s is preferably 1,580° C. or less, 1,500° C. or less, 1,450° C. or less, 1,400° C. or less, or 1,350° C. or less, particularly preferably from 1,200° C. to 1,300° C. When the temperature at $10^{2.5}$ dPa·s increases, meltability is degraded, and the manufacturing cost of a glass substrate rises. The "temperature at $10^{2.5}$ dPa·s" can be measured by the platinum sphere pull up method. The temperature at $10^{2.5}$ dPa·s corresponds to a melting temperature. As the melting temperature becomes lower, the meltability is enhanced.

In the supporting glass substrate of the present invention, a UV transmittance at a wavelength of 300 nm in the thickness direction is preferably 40% or more, 50% or more, 60% or more, or 70% or more, particularly preferably 80% or more. When the UV transmittance is excessively low, it becomes difficult to cause the processed substrate and the supporting substrate to adhere to each other with an adhesive layer through irradiation with UV rays, and in addition, it becomes difficult to peel the supporting substrate from the processed substrate with a peeling layer through irradiation with the UV rays. The "UV transmittance at a wavelength of 300 nm in the thickness direction" can be evaluated by, for example, measuring a spectral transmittance at a wavelength of 300 nm with a double-beam type spectrophotometer.

The supporting glass substrate of the present invention is preferably formed by a down-draw method, in particular, an overflow down-draw method. The overflow down-draw method refers to a method in which a molten glass is caused to overflow from both sides of a heat-resistant, trough-shaped structure, and the overflowing molten glasses are subjected to down-draw downward at the lower end of the trough-shaped structure while being joined, to thereby manufacture a glass substrate. When a glass substrate is produced by the overflow down-draw method, surfaces that are to serve as the surfaces of the glass substrate are formed in a state of free surfaces without being brought into contact with the trough-shaped refractory. Therefore, a glass substrate having a small thickness is manufactured easily, and the total thickness variation can be reduced. As a result, the total thickness variation is reduced easily to less than 2.0 μm through a small amount of polishing. The structure and material of the trough-shaped structure are not particularly limited as long as desired dimensions and surface accuracy can be realized. Further, a method of applying a force to glass at the time of performing down-draw downward is also not particularly limited. For example, there may be adopted a method involving rotating a heat-resistant roll having a sufficiently large width in a state of being in contact with glass, to thereby draw the glass, or a method involving allowing a plurality of pairs of heat-resistant rolls to come into contact with only the vicinities of end surfaces of glass, to thereby draw the glass.

As a method of forming a glass substrate, besides the overflow down-draw method, for example, a slot down method, a redraw method, a float method, a roll-out method, or the like may also be adopted.

It is preferred that the supporting glass substrate of the present invention have a polished surface on a surface thereof and be formed by the overflow down-draw method. With this, the total thickness variation before the polishing treatment is reduced, and hence the total thickness variation can be reduced to the extent possible through a small amount of polishing. The total thickness variation can be reduced to, for example, less than 2.0 μm, in particular, 1.0 μm or less.

It is preferred that the supporting glass substrate of the present invention not be subjected to ion exchange treatment and not have a compressive stress layer on the surface thereof. When the supporting glass substrate is subjected to the ion exchange treatment, the manufacturing cost of the supporting glass substrate rises. When the supporting glass substrate is subjected to the ion exchange treatment, it becomes difficult to reduce the total thickness variation of the supporting glass substrate. The supporting glass substrate of the present invention does not exclude the mode of being subjected to the ion exchange treatment, to thereby form a compressive stress layer on the surface thereof. From the viewpoint of increasing mechanical strength, it is preferred that the supporting glass substrate be subjected to the ion exchange treatment, to thereby form a compressive stress layer on the surface thereof.

The laminate of the present invention has a feature of comprising at least a processed substrate and a supporting glass substrate configured to support the processed substrate, the supporting glass substrate comprising the above-mentioned supporting glass substrate. Here, the technical features (preferred configuration and effects) of the laminate of the present invention overlap the technical features of the supporting glass substrate of the present invention. Thus, the details of the overlapping portions are omitted in this description.

It is preferred that the laminate of the present invention comprise an adhesive layer between the processed substrate and the supporting glass substrate. It is preferred that the adhesive layer be formed of a resin, and for example, a thermosetting resin, a photocurable resin (in particular, a UV-curable resin), and the like are preferred. It is preferred that the adhesive layer have heat resistance that withstands the heat treatment in the manufacturing process for a semiconductor package. With this, the adhesive layer is less liable to be melted in the manufacturing process for a semiconductor package, and the accuracy of the processing treatment can be enhanced.

It is preferred that the laminate of the present invention further comprise a peeling layer between the processed substrate and the supporting glass substrate, more specifically, between the processed substrate and the adhesive layer. With this, after the processed substrate is subjected to predetermined processing treatment, the processed substrate is easily peeled from the supporting glass substrate. From the viewpoint of productivity, it is preferred that the processed substrate be peeled from the supporting glass substrate through irradiation with laser light or the like.

The peeling layer is formed of a material in which "in-layer peeling" or "interfacial peeling" occurs through irradiation with laser light or the like. That is, the peeling layer is formed of a material in which the interatomic or intermolecular binding force between atoms or molecules is lost or reduced to cause ablation or the like, to thereby cause peeling, through irradiation with light having predetermined intensity. There are the case where components contained in the peeling layer turn into gas to be released, to thereby cause separation, through irradiation with light, and the case where the peeling layer absorbs light to turn into gas and the vapor thereof is released, to thereby cause separation.

In the laminate of the present invention, it is preferred that the supporting glass substrate be larger than the processed substrate. With this, even when the center positions of the processed substrate and the supporting glass substrate are slightly separated from each other at a time when the processed substrate and the supporting glass substrate are supported, an edge portion of the processed substrate is less liable to extend off from the supporting glass substrate.

A method of manufacturing a semiconductor package of the present invention has a feature of comprising the steps of: preparing a laminate comprising at least a processed substrate and a supporting glass substrate configured to support the processed substrate; conveying the laminate; and subjecting the processed substrate to processing treatment, the supporting glass substrate comprising the above-mentioned supporting glass substrate. Here, the technical features (preferred configuration and effects) of the method of manufacturing a semiconductor package of the present invention overlap the technical features of the supporting glass substrate and laminate of the present invention. Thus, the details of the overlapping portions are omitted in this description.

In the method of manufacturing a semiconductor package of the present invention, it is preferred that the processing treatment be treatment involving arranging wiring on one surface of the processed substrate or treatment involving forming solder bumps on one surface of the processed substrate. In the method of manufacturing a semiconductor package of the present invention, the total thickness variation of the supporting glass substrate is small, and hence, those steps can be performed properly.

Besides the foregoing, the processing treatment may be any of treatment involving mechanically polishing one surface (in general, the surface on an opposite side to the supporting glass substrate) of the processed substrate, treatment involving subjecting one surface (in general, the surface on an opposite side to the supporting glass substrate) of the processed substrate to dry etching, and treatment involving subjecting one surface (in general, the surface on an opposite side to the supporting glass substrate) of the processed substrate to wet etching. In the method of manufacturing a semiconductor package of the present invention, warpage is less liable to occur in the processed substrate, and the stiffness of the laminate can be maintained. As a result, the processing treatment can be performed properly.

The semiconductor package of the present invention has a feature of being manufactured by the above-mentioned method of manufacturing a semiconductor package. Here, the technical features (preferred configuration and effects) of the semiconductor package of the present invention overlap the technical features of the supporting glass substrate, laminate, and method of manufacturing a semiconductor package of the present invention. Thus, the details of the overlapping portions are omitted in this description.

The electronic device of the present invention has a feature of comprising a semiconductor package, the semiconductor package comprising the above-mentioned semiconductor package. Here, the technical features (preferred configuration and effects) of the electronic device of the present invention overlap the technical features of the supporting glass substrate, laminate, method of manufacturing a semiconductor package, and semiconductor package of the present invention. Thus, the details of the overlapping portions are omitted in this description.

The present invention is further described with reference to the drawings.

Figure 1:
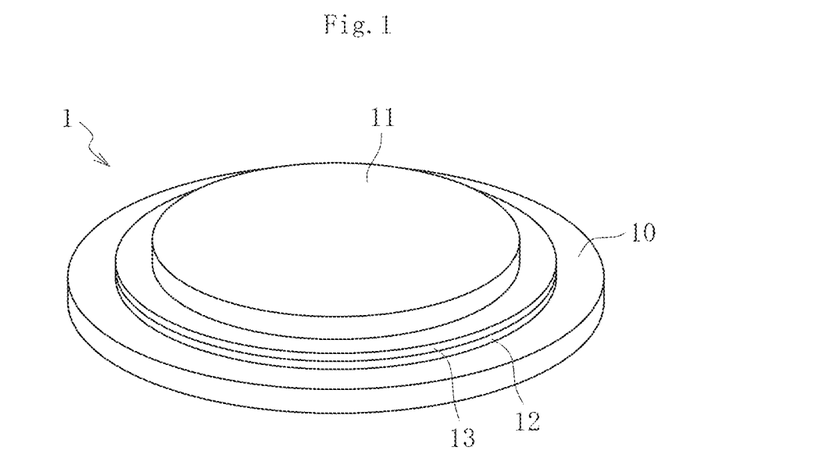
FIG. 1 is a schematic perspective view for illustrating an example of a laminate of the present invention.

FIG. 1 is a schematic perspective view for illustrating an example of a laminate 1 of the present invention. In FIG. 1, the laminate 1 comprises a supporting glass substrate 10 and a processed substrate 11. The supporting glass substrate 10 is bonded onto the processed substrate 11 in order to prevent a change in dimension of the processed substrate 11. A peeling layer 12 and an adhesive layer 13 are arranged between the supporting glass substrate 10 and the processed substrate 11. The peeling layer 12 is held in contact with the supporting glass substrate 10, and the adhesive layer 13 is held in contact with the processed substrate 11.

As is understood from FIG. 1, the laminate 1 comprises the supporting glass substrate 10, the peeling layer 12, the adhesive layer 13, and the processed substrate 11, which are laminated and arranged in the stated order. The shape of the supporting glass substrate 10 is determined in accordance with the processed substrate 11, and in FIG. 1, both the supporting glass substrate 10 and the processed substrate 11 have a substantially disc shape. In the peeling layer 12, silicon oxide, a silicate compound, silicon nitride, aluminum nitride, titanium nitride, or the like may be used besides amorphous silicon (a-Si). The peeling layer 12 is formed by plasma CVD, spin coating using a sol-gel method, or the like. The adhesive layer 13 is formed of a resin and formed through application by, for example, various printing methods, an ink-jet method, a spin-coating method, or a roll-coating method. The adhesive layer 13 is removed by being dissolved with a solvent or the like after the supporting glass substrate 10 is peeled from the processed substrate 11 with the peeling layer 12.

Figure 2A:
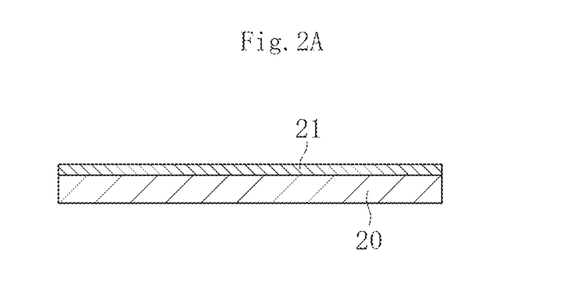
FIGS. 2A to 2G are schematic sectional views for illustrating a manufacturing process for a fan-out type WLP.
Figure 2B:
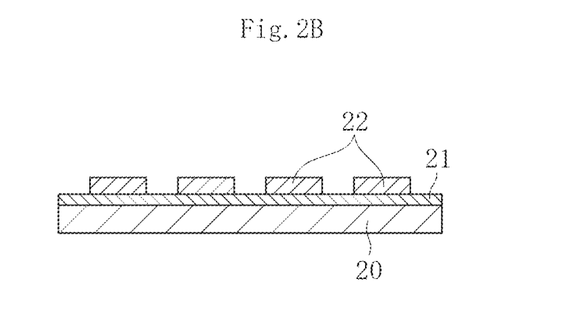
Figure 2C:
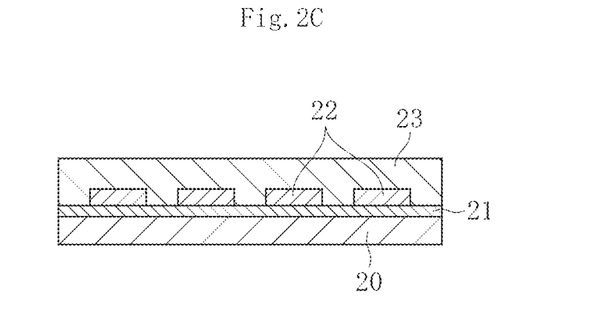
Figure 2D:
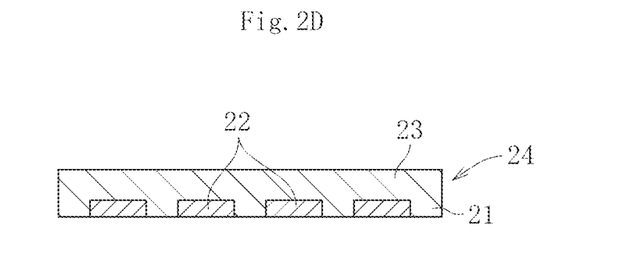
Figure 2E:
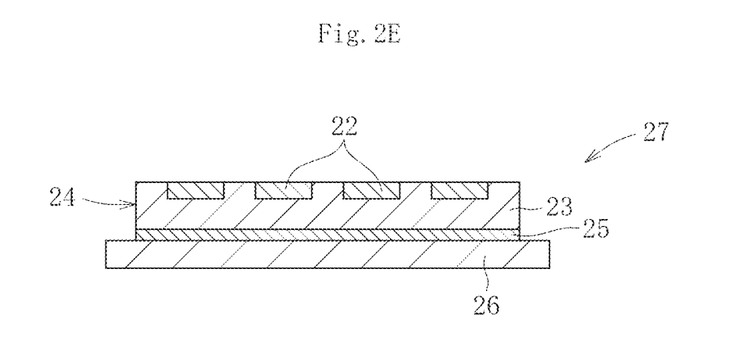
Figure 2F:
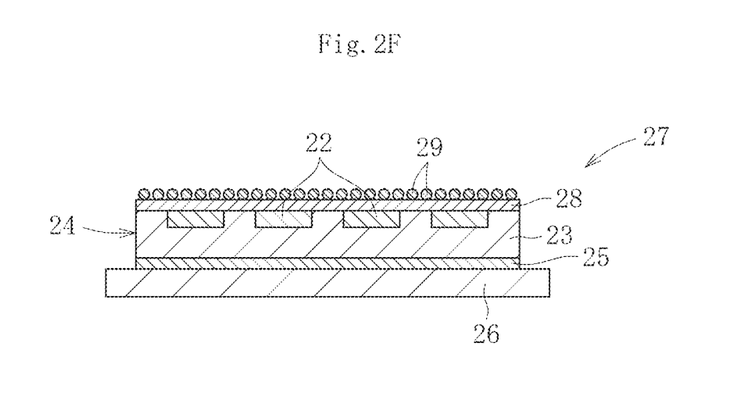
Figure 2G:
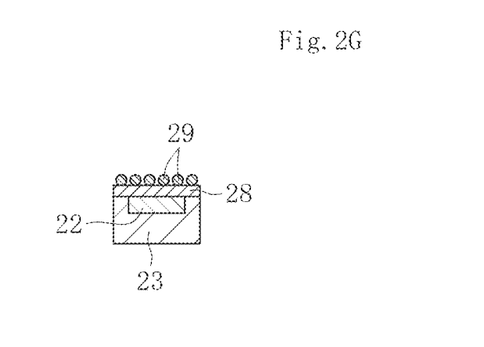

FIGS. 2A to 2G are schematic sectional views for illustrating a manufacturing process for a fan-out type WLP. FIG. 2A is an illustration of a state in which an adhesive layer 21 is formed on one surface of a supporting member 20. As necessary, a peeling layer may be formed between the supporting member 20 and the adhesive layer 21. Next, as illustrated in FIG. 2B, a plurality of semiconductor chips 22 are bonded onto the adhesive layer 21. In this case, an active surface of each semiconductor chip 22 is brought into contact with the adhesive layer 21. Then, as illustrated in FIG. 2C, the semiconductor chips 22 are molded with a sealing material 23 of a resin. As the sealing material 23, a material, which changes less in dimension after compression forming and changes less in dimension during formation of wiring, is used. Then, as illustrated in FIG. 2D and FIG. 2E, a processed substrate 24 having the semiconductor chips 22 molded therein is separated from the supporting member 20 and is adhesively fixed onto a supporting glass substrate 26 through intermediation of an adhesive layer 25. In this case, in the surface of the processed substrate 24, the surface on an opposite side to the surface in which the semiconductor chips 22 are buried is arranged on the supporting glass substrate 26 side. Thus, a laminate 27 can be obtained. As necessary, a peeling layer may be formed between the adhesive layer 25 and the supporting glass substrate 26. After the obtained laminate 27 is conveyed, as illustrated in FIG. 2F, wiring 28 is formed on the surface of the processed substrate 24 in which the semiconductor chips 22 are buried, and then a plurality of solder bumps 29 are formed. Finally, the processed substrate 24 is separated from the supporting glass substrate 26 and cut for each semiconductor chip 22 to be used in a later packaging step (FIG. 2G).

EXAMPLES

Example 1

Now, the present invention is described with reference to Examples. However, Examples below are merely examples, and the present invention is by no means limited thereto.

Figure 3:
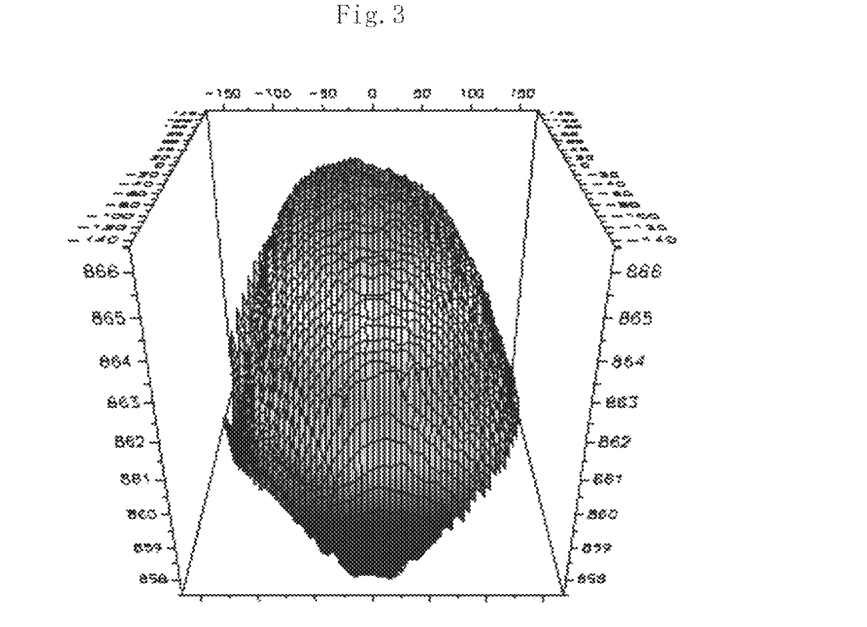
FIG. 3 is a 3D image for showing a surface state of a sample 1 before polishing treatment according to [Example 1].

Glass raw materials were blended so as to comprise as a glass composition, in terms of mass %, 65.7% of $SiO_2$, 22% of $Al_2O_3$, 3.7% of $Li_2O$, 0.3% of $Na_2O$, 0.3% of $K_2O$, 0.7% of MgO, 1% of BaO, 2% of $TiO_2$, 2.7% of $ZrO_2$, 1.4% of $P_2O_5$, and 0.2% of $SnO_2$. After that, the resultant was loaded into a glass melting furnace to be melted at from 1,500° C. to 1,600° C. Then, the molten glass was supplied into a roll-out forming device so as to be formed to a thickness of 0.7 mm. Finally, the resultant was subjected to boring to be formed into a substantially disc shape. The obtained glass substrate was measured for an average thermal expansion coefficient within a temperature range of from 30° C. to 380° C. As a result, the average thermal expansion coefficient was $44 \times 10^{-7}$/° C. Each of the obtained glass substrates (seven samples) was measured for a center thickness, a maximum thickness, a minimum thickness, an average thickness, a total thickness variation (TTV), and a warpage level (Warp) with a Bow/Warp measurement apparatus SBW-331ML/d manufactured by Kobelco Research Institute, Inc. The results are shown in Table 1 and FIG. 3. FIG. 3 is a 3D image obtained with the Bow/Warp measurement apparatus SBW-331ML/d manufactured by Kobelco Research Institute, Inc.

Figure 4:
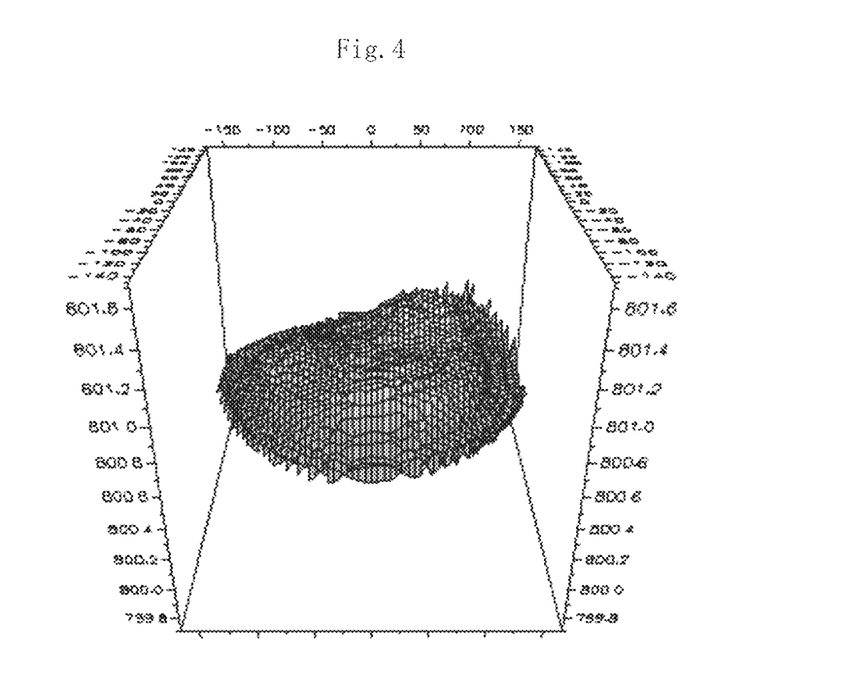
FIG. 4 is a 3D image for showing a surface state of a sample 1 after polishing treatment according to [Example 1].

Then, the surface of the glass substrate was subjected to polishing treatment with a polishing device. Specifically, both surfaces of the glass substrate were sandwiched between a pair of polishing pads having different outer diameters, and both the surfaces of the glass substrate were subjected to polishing treatment while the glass substrate and the pair of polishing pads were rotated together. A part of the glass substrate was caused to extend off from the polishing pads intermittently during the polishing treatment. The polishing pads were formed of urethane. The average particle diameter of a polishing slurry used for the polishing treatment was 2.5 μm, and the polishing speed was 15 m/min. Each of the obtained polished glass substrates (seven samples) was measured for a center thickness, a maximum thickness, a minimum thickness, an average thickness, a total thickness variation (TTV), and a warpage level (Warp) with the Bow/Warp measurement apparatus SBW-331ML/d manufactured by Kobelco Research Institute, Inc. The results are shown in Table 2 and FIG. 4. FIG. 4 is a 3D image obtained with the Bow/Warp measurement apparatus SBW-331ML/d manufactured by Kobelco Research Institute, Inc.

TABLE 1

|  | Center Thickness (μm) | Maximum Thickness (μm) | Minimum Thickness (μm) | Average Thickness (μm) | TTV (μm) | Warp (μm) |
| --- | --- | --- | --- | --- | --- | --- |
| Sample 1 | 866.0 | 866.4 | 857.5 | 864.0 | 8.9 | 48 |
| Sample 2 | 867.6 | 868.0 | 862.2 | 866.3 | 5.8 | 46 |
| Sample 3 | 864.3 | 865.7 | 860.0 | 863.2 | 5.7 | 48 |
| Sample 4 | 868.0 | 868.3 | 862.9 | 866.4 | 5.4 | 39 |
| Sample 5 | 867.0 | 867.5 | 861.2 | 865.7 | 6.3 | 49 |
| Sample 6 | 866.8 | 867.2 | 861.9 | 865.5 | 5.2 | 43 |
| Sample 7 | 867.6 | 869.5 | 860.6 | 866.1 | 8.9 | 49 |

TABLE 2

|  | Center Thickness (μm) | Maximum Thickness (μm) | Minimum Thickness (μm) | Average Thickness (μm) | TTV (μm) | Warp (μm) |
| --- | --- | --- | --- | --- | --- | --- |
| Sample 1 | 800.9 | 801.0 | 800.4 | 800.8 | 0.6 | 44 |
| Sample 2 | 800.2 | 800.3 | 799.8 | 800.2 | 0.5 | 45 |
| Sample 3 | 800.8 | 801.1 | 800.6 | 800.8 | 0.5 | 45 |
| Sample 4 | 801.9 | 801.9 | 801.5 | 801.8 | 0.5 | 35 |
| Sample 5 | 801.1 | 801.4 | 800.7 | 801.1 | 0.7 | 54 |
| Sample 6 | 803.3 | 803.4 | 802.9 | 803.2 | 0.5 | 41 |
| Sample 7 | 803.8 | 803.8 | 803.3 | 803.7 | 0.6 | 54 |

As is apparent from Tables 1 and 2 and FIGS. 3 and 4, the polished glass substrate has a small total thickness variation and a small warpage level and hence is considered to be suitable as the supporting glass substrate.

Example 2

First, glass raw materials were blended so as to have a glass composition of each of Sample Nos. 1 to 7 shown in Table 3. After that, the resultant was loaded into a glass melting furnace to be melted at from 1,500° C. to 1,600° C. Then, the molten glass was supplied into an overflow down-draw forming device so as to be formed to a thickness of 0.8 mm. Each obtained glass substrate was evaluated for an average thermal expansion coefficient $\alpha_{30\text{-}380}$ within a temperature range of from 30° C. to 380° C., a density ρ, a strain point Ps, an annealing point Ta, a softening point Ts, a temperature at a viscosity at high temperature of $10^{4.0}$ dPa·s, a temperature at a viscosity at high temperature of $10^{3.0}$ dPa·s, a temperature at a viscosity at high temperature of $10^{2.5}$ dP·s, a temperature at a viscosity at high temperature of $10^{2.0}$ dPa·s, a liquidus temperature TL, and a Young's modulus E. Each glass substrate after forming was measured for a total thickness variation and a warpage level with the Bow/Warp measurement apparatus SBW-331ML/d manufactured by Kobelco Research Institute, Inc. As a result, each total thickness variation was 3 μm, and each warpage level was 70 μm.

TABLE 3

|  |  | No. 1 | No. 2 | No. 3 | No. 4 | No. 5 | No. 6 | No. 7 |
| --- | --- | --- | --- | --- | --- | --- | --- | --- |
| Components (wt %) | $SiO_2$ | 65.0 | 63.2 | 65.3 | 64.0 | 60.0 | 58.4 | 61.4 |
|  | $Al_2O_3$ | 8.2 | 8.0 | 8.0 | 8.0 | 16.7 | 13.0 | 18.0 |
|  | $B_2O_3$ | 13.5 | 13.1 | 8.6 | 13.3 | 9.8 | 0.0 | 0.5 |
|  | MgO | 0.0 | 0.0 | 0.0 | 0.0 | 0.8 | 2.0 | 3.0 |
|  | CaO | 3.3 | 3.2 | 3.2 | 3.2 | 8.0 | 2.0 | 0.0 |
|  | SrO | 0.0 | 0.0 | 0.0 | 0.0 | 4.5 | 0.0 | 0.0 |
|  | ZnO | 0.9 | 0.9 | 0.9 | 1.0 | 0.0 | 0.0 | 0.0 |
|  | $Na_2O$ | 8.7 | 11.3 | 13.6 | 10.1 | 0.0 | 14.5 | 14.5 |
|  | $K_2O$ | 0.0 | 0.0 | 0.0 | 0.0 | 0.0 | 5.5 | 2.0 |
|  | $ZrO_2$ | 0.0 | 0.0 | 0.0 | 0.0 | 0.0 | 4.5 | 0.0 |
|  | $Sb_2O_3$ | 0.1 | 0.0 | 0.1 | 0.1 | 0.0 | 0.0 | 0.0 |
|  | $SnO_2$ | 0.3 | 0.3 | 0.3 | 0.3 | 0.2 | 0.0 | 0.7 |
| $\alpha_{30\text{-}380}$ (×$10^{-7}$/° C.) | | 59 | 68 | 77 | 64 | 38 | 102 | 91 |
| ρ (g/cm³) | | 2.39 | 2.43 | 2.47 | 2.41 | 2.46 | 2.54 | 2.45 |
| Ps (° C.) | | 535 | 530 | 530 | 530 | 673 | 533 | 564 |
| Ta (° C.) | | 570 | 565 | 565 | 565 | 725 | 576 | 613 |
| Ts (° C.) | | 755 | 730 | 735 | 740 | 943 | 793 | 863 |
| 104.0 dPa·s (° C.) | | 1,095 | 1,050 | 1,045 | 1,065 | 1,256 | 1,142 | 1,255 |
| 103.0 dPa·s (° C.) | | 1,305 | 1,240 | 1,240 | 1,265 | Unmeasured | 1,319 | 1,460 |
| 102.5 dPa·s (° C.) | | 1,450 | 1,385 | 1,380 | 1,410 | 1,519 | 1,431 | 1,591 |
| 102.0 dPa·s (° C.) | | 1,640 | 1,570 | 1,540 | 1,595 | Unmeasured | Unmeasured | Unmeasured |
| TL (° C.) | | 890 | 802 | 800 | 850 | Unmeasured | 880 | 970 |
| E (GPa) | | 71 | 74 | 75 | 75 | 75 | 75 | 71 |

The average thermal expansion coefficient $\alpha_{30\text{-}380}$ within a temperature range of from 30° C. to 380° C. is a value measured with a dilatometer.

The density $\rho$ is a value measured by a well-known known Archimedes method.

The strain point Ps, the annealing point Ta, and the softening point Ts are values obtained by measurement based on the method of ASTM C336.

The temperatures at viscosities at high temperature of $10^{4.0}$ dPa·s, $10^{3.0}$ dPa·s, and $10^{2.5}$ dPa·s are values obtained by measurement by a platinum sphere pull up method.

The liquidus temperature TL is a value obtained by loading glass powder that has passed through a standard 30-mesh sieve (500 μm) and remained on a 50-mesh sieve (300 μm) into a platinum boat, keeping the glass powder for 24 hours in a gradient heating furnace, and then measuring, by a microscopic observation, a temperature at which crystals of glass are deposited.

The Young's modulus E is a value measured by a resonance method.

Then, the surface of the glass substrate was subjected to polishing treatment with a polishing device. Specifically, both surfaces of the glass substrate were sandwiched between a pair of polishing pads having different outer diameters, and both the surfaces of the glass substrate were subjected to polishing treatment while the glass substrate and the pair of polishing pads were rotated together. A part of the glass substrate was caused to extend off from the polishing pads intermittently during the polishing treatment. The polishing pads were formed of urethane. The average particle diameter of a polishing slurry used for the polishing treatment was 2.5 μm, and the polishing speed was 15 m/min. Each obtained polished glass substrate was measured for a total thickness variation and a warpage level by the Bow/Warp measurement apparatus SBW-331ML/d manufactured by Kobelco Research Institute, Inc. As a result, each total thickness variation was 0.45 μm, and each warpage level was 35 μm.

REFERENCE SIGNS LIST 1, 27 laminate
10, 26 supporting glass substrate
11, 24 processed substrate
12 peeling layer
13, 21, 25 adhesive layer
20 supporting member
22 semiconductor chip
23 sealing material
28 wiring
29 solder bump

The invention claimed is:

1. A method of manufacturing a semiconductor package, the method comprising the steps of:

preparing a supporting glass substrate free of any through holes, the supporting glass substrate comprising a first surface and a second surface opposite to the first surface and the supporting glass substrate having a Young's modulus of 65 GPa or more;

sandwiching the first surface and the second surface of the supporting glass substrate with a pair of polishing pads;

polishing the first surface and the second surface of the supporting glass substrate, which is free of any through holes, so that the supporting glass substrate has a total thickness variation of less than 5.0 μm while rotating the supporting glass substrate and the pair of polishing pads together so that a part of the supporting glass substrate intermittently extends off from the polishing pads during the polishing;

preparing a processed substrate, the processed substrate comprising at least a semiconductor chip molded with a sealing material;

laminating the polished supporting glass substrate and the processed substrate to obtain a laminate;

conveying the laminate; and subjecting the processed substrate of the laminate to processing treatment after the conveying.

2. The method of manufacturing a semiconductor package according to claim 1, wherein the processing treatment comprises a step of arranging wiring on a first surface of the processed substrate.

3. The method of manufacturing a semiconductor package according to claim 2, wherein the processing treatment further comprises a step of forming a solder bump on the first surface of the processed substrate.

4. The method of manufacturing a semiconductor package according to claim 2, wherein the supporting glass substrate is formed by an overflow down-draw method.

5. The method of manufacturing a semiconductor package according to claim 2, wherein the supporting glass substrate has a total thickness variation of less than 2.0 μm.

6. The method of manufacturing a semiconductor package according to claim 2, wherein the supporting glass substrate has a warpage level of 60 μm or less.

7. The method of manufacturing a semiconductor package according to claim 1, wherein the processing treatment comprises a step of forming a solder bump on a first surface of the processed substrate.

8. The method of manufacturing a semiconductor package according to claim 1, wherein the supporting glass substrate is formed by an overflow down-draw method.

9. The method of manufacturing a semiconductor package according to claim 1, wherein the supporting glass substrate has a total thickness variation of less than 2.0 μm.

10. The method of manufacturing a semiconductor package according to claim 1, wherein the supporting glass substrate has a warpage level of 60 μm or less.

* * * * *